US012355017B2

(12) United States Patent
Shih et al.

(10) Patent No.: US 12,355,017 B2
(45) Date of Patent: Jul. 8, 2025

(54) DISPLAY PANEL AND TILED DISPLAY DEVICE

(71) Applicant: Innolux Corporation, Miao-Li County (TW)

(72) Inventors: Jian-Jung Shih, Miao-Li County (TW); Tsau-Hua Hsieh, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 729 days.

(21) Appl. No.: 17/169,561

(22) Filed: Feb. 8, 2021

(65) Prior Publication Data

US 2021/0257347 A1    Aug. 19, 2021

Related U.S. Application Data

(60) Provisional application No. 62/978,302, filed on Feb. 19, 2020.

(30) Foreign Application Priority Data

Nov. 27, 2020 (CN) .......................... 202011364441.1

(51) Int. Cl.
H01L 25/16 (2023.01)
(52) U.S. Cl.
CPC .......... H01L 25/162 (2013.01); H01L 25/167 (2013.01)

(58) Field of Classification Search
None
See application file for complete search history.

(56) References Cited

U.S. PATENT DOCUMENTS

2002/0140629 A1    10/2002    Sundahl
2017/0286044 A1*   10/2017    Kim ..................... G09G 3/3208

FOREIGN PATENT DOCUMENTS

| CN | 102096263 | 6/2011 |
| CN | 104851373 | 8/2015 |
| EP | 3477699 | 5/2019 |
| WO | 2017045549 | 7/2019 |

OTHER PUBLICATIONS

"Search Report of Europe Counterpart Application", issued on Jun. 23, 2021, p. 1-p. 10.
"Office Action of China Counterpart Application", issued on Jun. 8, 2022, p. 1-p. 7.

* cited by examiner

Primary Examiner — Nishath Yasmeen
(74) Attorney, Agent, or Firm — JCIPRNET

(57) ABSTRACT

The disclosure provides a display panel and a tiled display device. The display panel has a tiling edge and includes a non-transparent part and a transparent part. The transparent part has a peripheral edge. At least a portion of the peripheral edge of the transparent part is overlapped with the tiling edge. The tiled display device includes a plurality of display panels tiled together by the tiling edges thereof.

19 Claims, 10 Drawing Sheets

DISPLAY PANEL AND TILED DISPLAY DEVICE

CROSS-REFERENCE TO RELATED APPLICATION

This application claims the priority benefit of U.S. provisional application Ser. No. 62/978,302, filed on Feb. 19, 2020, and China application serial no. 202011364441.1, filed on Nov. 27, 2020. The entirety of each of the above-mentioned patent applications is hereby incorporated by reference herein and made a part of this specification.

BACKGROUND

Field of the Disclosure

The disclosure relates to a display panel and a tiled display device.

Description of Related Art

With the development of display-related techniques, public information display (PID) has attracted more and more attention from the display industry in recent years. PID products are applied to school bulletin boards, retail signs, or small-sized analog signs, and PID products are even applied to transparent objects such as large glass buildings and commercial glass windows. In order to provide a large enough display area, public displays are often implemented by tiling display panels.

SUMMARY

The disclosure provides a tiled display device and a display panel thereof having good display effects.

According to an embodiment of the disclosure, a display panel has a tiling edge and includes a non-transparent part and a transparent part. The transparent part has a peripheral edge. At least a portion of the peripheral edge of the transparent part is overlapped with the tiling edge.

According to an embodiment of the disclosure, a tiled display device includes at least two display panels. Each of the display panels has a tiling edge and includes a non-transparent part and a transparent part. The transparent part has a peripheral edge, and at least a portion of the peripheral edge of the transparent part is overlapped with the tiling edge. The at least two display panels are tiled together by the tiling edges thereof.

Based on the above, in the tiled display device of an embodiment of the disclosure, at least two display panels are tiled together, wherein the display panels have a transparent part, and at least a portion of the peripheral edges of the transparent parts of the display panels is overlapped with the tiling edges of the display panels. Therefore, the tiling gap between adjacent display panels is not readily noticeable, thus helping to improve the display effect of the tiled display device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
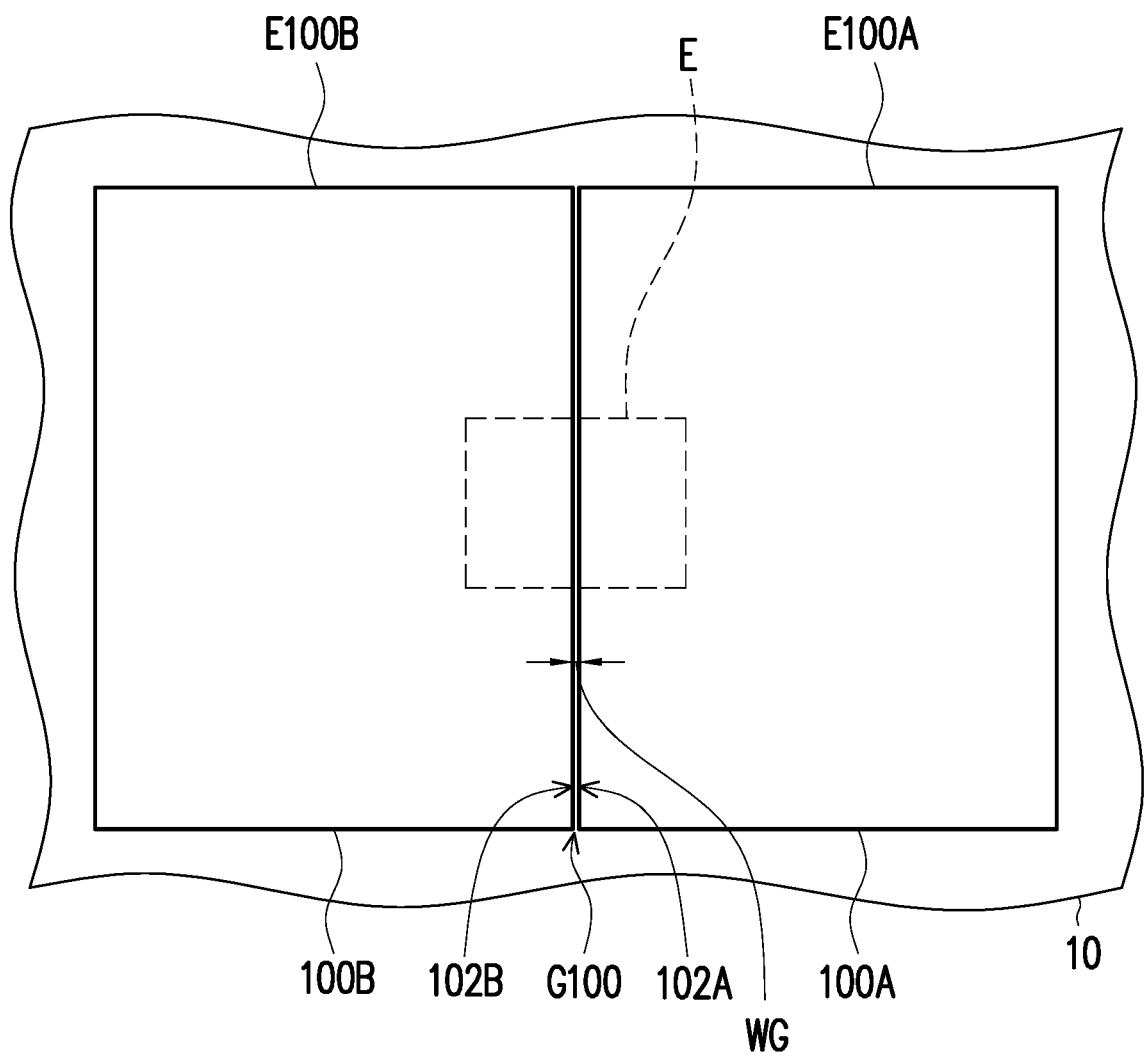
FIG. 1 is a diagram of a tiled display device of an embodiment of the disclosure.

Hereinafter, reference will be made in detail to exemplary embodiments of the disclosure, and examples of the exemplary embodiments are illustrated in the figures.

Wherever possible, the same reference numerals are used in the figures and the descriptions to refer to the same or similar portions.

A structure (or layer, component, or substrate) described in the disclosure located on/above another structure (or layer, component, or substrate) may mean that the two structures are adjacent and directly connected, or may mean that two structures are adjacent rather than directly connected. Indirect connections refer to at least one intermediate structure (or intermediate layer, intermediate component, intermediate substrate, intermediate spacing) between two structures. The lower side surface of a structure is adjacent or directly connected to the upper side surface of the intermediate structure, and the upper side surface of another structure is adjacent or directly connected to the lower side surface of the intermediate structure. The intermediate structure may be formed by a single-layer or multi-layer physical structure or a non-physical structure without limitation. In the disclosure, when a certain structure is disposed "on" another structure, it may mean that the certain structure is "directly" on the other structure, or that the certain structure is "indirectly" on the other structure, that is, at least one structure is further sandwiched between the certain structure and the other structure.

The electrical connection or coupling described in the disclosure may refer to direct connection or indirect connection. In the case of direct connection, the endpoints of the components on two circuits are directly connected or connected to each other via a conductor line segment. In the case of indirect connection, there are switches, diodes, capacitors, inductors, resistors, other suitable components, or a combination of the above components between the endpoints of the components on two circuits. However, the disclosure is not limited thereto.

In the disclosure, the thickness, length, and width may be measured using an optical microscope, and the thickness or width may be measured by a cross-sectional image in an electron microscope, but are not limited thereto. Moreover, a certain error may exist between any two competing values or directions. Moreover, the terms "about", "equal to", "equal", "same", "substantially", or "essentially" mentioned in the disclosure usually represent falling within 15% of a given value or range, or means falling within 5%, 3%, 2%, 1%, or 0.5% of a given value or range. In addition, "the given range is from a first value to a second value" and "the given range falls within the range of a first value to a second value" mean the given range includes the first value, the second value, and other values in between.

It should be noted that the following embodiments may replace, recombine, and mix the features of several different embodiments without departing from the spirit of the disclosure to complete other embodiments. As long as the features between the embodiments do not violate the spirit of the disclosure or conflict with each other, they may be mixed and used arbitrarily.

FIG. 1 is a diagram of a tiled display device of an embodiment of the disclosure. A tiled display device 10 shown in FIG. 1 is formed by tiling a plurality of display panels, for example. FIG. 1 schematically uses two display panels, namely a first display panel 100A and a second display panel 100B, to form the tiled display device 10 for illustration. In other embodiments, the tiled display device 10 may be formed by tiling three or more display panels. The first display panel 100A and the second display panel 100B forming the tiled display device 10 are, for example, transparent display panels. For example, in addition to the first display panel 100A and the second display panel 100B having the function of displaying images, the user may also see the background behind the first display panel 100A and the second display panel 100B through the first display panel 100A and the second display panel 100B. Therefore, the tiled display device 10 may be applied to glass windows or similar items. In addition, the tiled display device 10 may be formed by tiling a plurality of display panels, so the size of the tiled display device 10 may meet different application requirements without being limited by the size of a single display panel.

The display panels forming the tiled display device 10 have a tiling edge for tiling with an adjacent display panel. For example, the first display panel 100A and the second display panel 100B are adjacent to each other, which means that there are no other display panels between the first display panel 100A and the second display panel 100B. In detail, the first display panel 100A and the second display panel 100B may be adjacent to each other in a first direction D1, and may be tiled along the first direction D1. In other words, the first direction D1 may be regarded as the tiling direction in which the first display panel 100A and the second display panel 100B are tiled to each other. The first display panel 100A has a first tiling edge 102A, and the second display panel 100B has a second tiling edge 102B. The first tiling edge 102A may be a portion of an edge E100A of the first display panel 100A adjacent to the second display panel 100B, and the second tiling edge 102B may be a portion of an edge E100B of the second display panel 100B adjacent to the first display panel 100A. The first tiling edge 102A and the second tiling edge 102B are adjacent to each other to tile the first display panel 100A and the second display panel 100B together. In some embodiments, the first tiling edge 102A and the second tiling edge 102B may be straight edges, respectively, and there may be a tiling gap G100 between the first tiling edge 102A and the second tiling edge 102B, wherein a width WG of the tiling gap G100 may be constant, and the width WG may be the smallest distance measured in the first direction D1 between the first display panel 100A and the second display panel 100B. In other embodiments, the first tiling edge 102A and the second tiling edge 102B may be edges of other shapes, respectively. In some embodiments, a suitable mechanism (not shown) may be used to assemble the first display panel 100A and the second display panel 100B together. The width of the tiling gap G100 may be determined based on the assembly accuracy of the mechanism, for example. The tiling gap G100 may be configured so that the user cannot readily notice the boundary between the first display panel 100A and the second display panel 100B when viewing the tiled display device 10. In some embodiments, the width WG of the tiling gap G100 is not particularly limited. According to some embodiments, the width WG of the tiling gap G100 may be adjusted according to the actual needs of the tiled display device 10 and visual experience.

Figure 2:
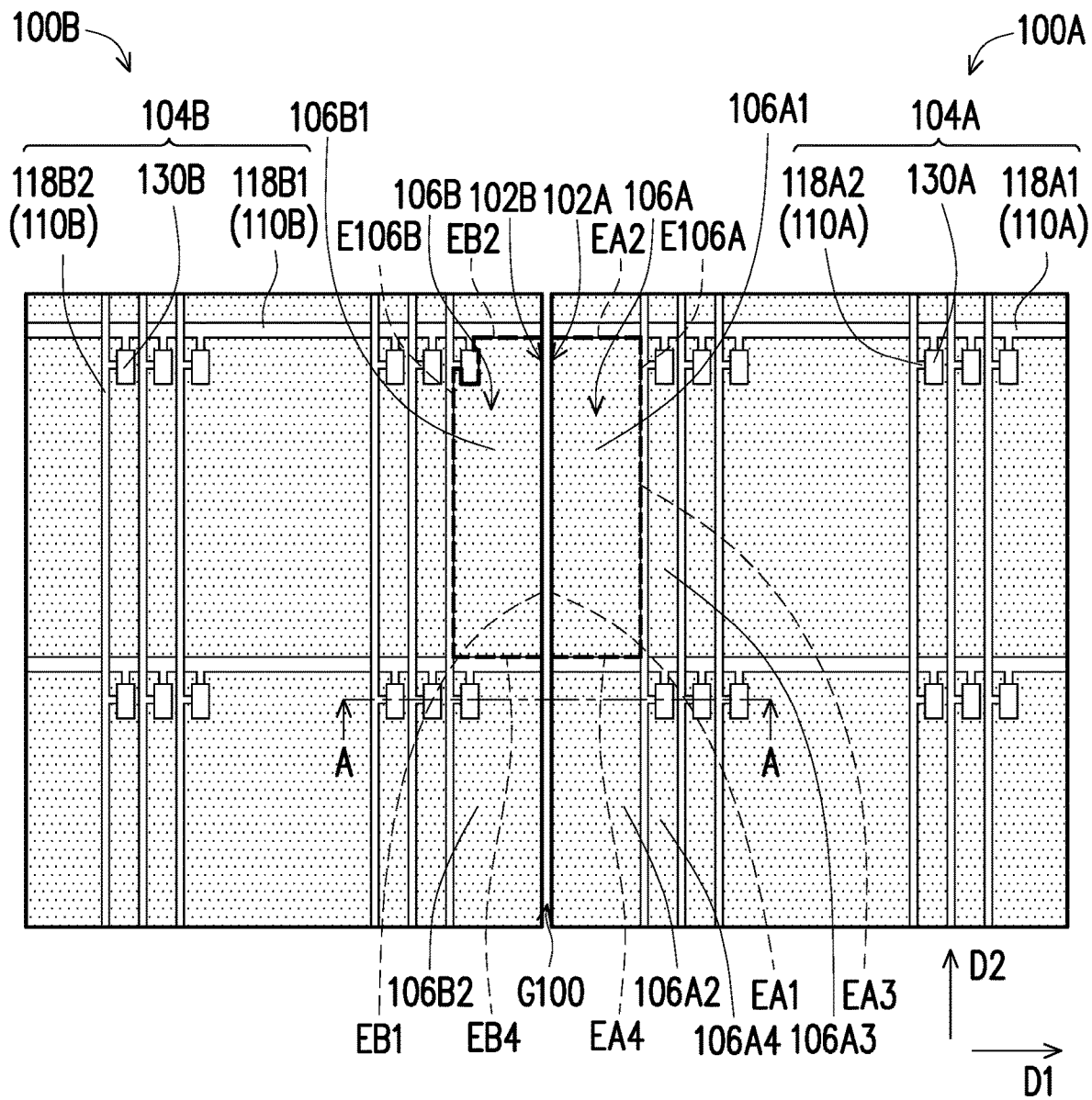
FIG. 2 schematically shows an embodiment of an area E of a tiled display device 10.

FIG. 2 schematically shows an embodiment of an area E of the tiled display device 10 shown in FIG. 1. In FIG. 2, the first display panel 100A includes a first non-transparent part 104A and a first transparent part 106A. The first non-transparent part 104A is a part defined by a non-transparent member, and the first transparent part 106A is a part other than the first non-transparent part 104A. The non-transparent member may include a signal line, a light-emitting element, a pixel circuit, or a combination thereof. The part marked with dots in FIG. 2 is the first transparent part 106A. According to some embodiments, the non-transparent member may include a signal line and a light-emitting element. Specifically, the first non-transparent part 104A of the first display panel 100A includes a plurality of first signal lines 110A and a plurality of first light-emitting elements 130A. As shown in FIG. 2, the plurality of first signal lines 110A may include a plurality of power lines 118A1 and 118A2. The power line 118A1 may be extended along the first direction D1, and the power line 118A2 may be extended along a second direction D2, but the disclosure is not limited thereto. The first direction D1 and the second direction D2 may be different. For example, they may be perpendicular to each other, but are not limited thereto. Taking one first light-emitting element 130A as an example, one end of the first light-emitting element 130A may be connected to the power line 118A1, and the other end of the first light-emitting element 130A may be connected to the power line 118A2, so that the first light-emitting element 130A may emit light. According to some embodiments, the first non-transparent part 104A may include the plurality of first signal lines 110A, the plurality of light-emitting elements 130A, and a plurality of pixel circuits (not shown). The plurality of pixel circuits may be electrically connected to the plurality of first signal lines 110A, and the plurality of light-emitting elements 130A may be driven by the plurality of pixel circuits.

As shown in FIG. 2, the part marked with dots is the first transparent part 106A. As shown in FIG. 2, by the plurality of first signal lines 110A and the plurality of first light-emitting elements 130A in the first non-transparent part 104A, the first transparent part 106A may be divided into a plurality of first transparent sub-parts, such as first transparent sub-parts 106A1, 106A2, 106A3, and 106A4 indicated in FIG. 2. The first transparent sub-parts 106A1 and 106A2 are the transparent sub-parts closest to the first tiling edge 102A. A first peripheral edge E106A of the first transparent sub-part 106A1 is framed by a dotted line in FIG. 2. The first peripheral edge E106A has a first side EA1, a second side EA2, a third side EA3, and a fourth side EA4. The first side EA1 and the third side EA3 may be parallel to the second direction D2, the second side EA2 and the fourth side EA4 may be parallel to the first direction D1, the first side EA1 is connected to the second side EA2 and the fourth side EA4, the second side EA2 is connected to the third side EA3, and the third side EA3 is connected to the fourth side EA4 to form the first peripheral edge E106A.

According to some embodiments, at least a portion of the peripheral edge of the first transparent part 106A is overlapped with the first tiling edge 102A of the first display panel 100A. In detail, as shown in FIG. 2, the first side EA1 of the first peripheral edge E106A of the first transparent sub-part 106A1 may be overlapped with the first tiling edge 102A of the first display panel 100A. According to some embodiments, at least a portion of the first transparent part 106A is located between the first tiling edge 102A and the first non-transparent part 104A. In detail, as shown in FIG. 2, the first transparent sub-part 106A1 in the first transparent part 106A is located between the first tiling edge 102A and the first non-transparent part 104A. The first transparent sub-part 106A2 in the first transparent part 106A is located between the first tiling edge 102A and the first non-transparent part 104A.

In the first non-transparent part 104A, the first signal lines 110A may be made of a non-transparent material such as metal or a material having good conductivity. The first signal lines 110A may be used to transmit a signal needed to cause the light-emitting elements 130A to emit light. In some embodiments, the first signal lines 110A may include different signal lines transmitting different signals. According to some embodiments, the first signal lines 110A may include power lines, scan lines, data lines, other signal lines, or a combination thereof. The power lines may be signal lines transmitting a power signal Vdd, or signal lines transmitting a power signal Vss.

The first light-emitting elements 130A are, for example, light-emitting diode elements, but are not limited thereto. The first light-emitting elements 130A may include light-emitting elements of a plurality of colors, such as red light-emitting elements, blue light-emitting elements, green light-emitting elements, cyan light-emitting elements, yellow light-emitting elements, and the like. In some embodiments, the first light-emitting elements 130A are, for example, millimeter light-emitting diodes, micron light-emitting diodes, quantum dot light-emitting diodes, or other pre-fabricated light-emitting elements. When the first light-emitting elements 130A have a plurality of colors, a colorful display effect may be achieved. The first light-emitting elements 130A are, for example, pre-fabricated light-emitting elements, and the first light-emitting elements may be bonded to the first signal lines 110A by a suitable transfer technique. For example, the first light-emitting elements 130A may be bonded to the first signal lines 110A using a flip-chip bonding technique.

The second display panel 100B has a second non-transparent part 104B and a second transparent part 106B. The second non-transparent part 104B is a part defined by a non-transparent member, and the second transparent part 106B is a part other than the second non-transparent part 104B. In the second display panel 100B, the part marked with dots in FIG. 2 is the second transparent part 106B. According to some embodiments, the non-transparent member may include a plurality of second signal lines 110B and a plurality of light-emitting elements 130B. The plurality of second signal lines 110B may include a plurality of power lines 118B1 and 118B2. The power line 118B1 may be extended along the first direction D1, and the power line 118B2 may be extended along the second direction D2, but the disclosure is not limited thereto. Taking one second light-emitting element 130B as an example, one end of the second light-emitting element 130B may be connected to the power line 118B1, and the other end of the second light-emitting element 130B may be connected to the power line 118B2, so that the second light-emitting element 130B may emit light. The definitions and structures of the other second non-transparent part 104B and the second transparent part 106B are the same as or similar to those of the first non-transparent part 104A and the first transparent part 106A, and are not repeated herein.

According to some embodiments, at least a portion of the peripheral edge of the second transparent part 106B is overlapped with the second tiling edge 102B of the second display panel 100B. The second transparent part 106B may include a second transparent sub-part 106B1 and a second transparent sub-part 106B2, which are the transparent sub-parts closest to the second tiling edge 102B. In detail, as shown in FIG. 2, a first side EB1 of a second peripheral edge E106B of the second transparent sub-part 106B1 may be overlapped with the second tiling edge 102B of the second display panel 100B. The first side EB1 is a side parallel to the second direction D2 in the second transparent sub-part 106B1. According to some embodiments, at least a portion of the second transparent part 106B is located between the second tiling edge 102B and the second non-transparent part 104B. In detail, as shown in FIG. 2, the second transparent sub-part 106B1 in the second transparent part 106B is located between the second tiling edge 102B and the second non-transparent part 104B. The second transparent sub-part 106B2 in the second transparent part 106B is located between the second tiling edge 102B and the second non-transparent part 104B.

As described above, according to some embodiments, the transparent parts of the display panels are disposed close to the tiling edges. Specifically, at least a portion of the first peripheral edge E106A of the first transparent part 106A of the first display panel 100A is overlapped with the first tiling edge 102A. In this way, the user does not readily notice the tiled structure and the tiling gap when viewing the tiled display device 10. Therefore, the tiled display device 10 may provide an ideal display effect.

According to some embodiments, at least a portion of the second transparent part 106B may be aligned with the first transparent part 106A at the second tiling edge 102B. For example, in FIG. 2, at least a portion of the first peripheral edge E106A of the first transparent sub-part 106A1 of the first display panel 100A may be aligned with at least a portion of the second peripheral edge E106B of the second transparent sub-part 106B1 of the second display panel 100B. Specifically, according to some embodiments, the second side EA2 of the first peripheral edge E106A of the first transparent sub-part 106A1 and the second side EB2 of the second peripheral edge E106B of the second transparent sub-part 106B1 may be aligned in the first direction D1. According to some embodiments, the fourth side EA4 of the first peripheral edge E106A of the first transparent sub-part 106A1 and a fourth side EB4 of the second peripheral edge E106B of the second transparent sub-part 106B1 may be aligned in the first direction D1. As described above, a portion of the first transparent part 106A of the first display panel 100A and a portion of the second transparent part 106B of the second display panel 100B may be aligned with each other. In this way, the user may feel that the first transparent part 106A and the second transparent part 106B form a continuous transparent part when viewing the tiled display device 10 (as shown in FIG. 1), so that the tiled structure and the tiling gap of the first display panel 100A and the second display panel 100B are not readily noticeable. Therefore, the tiled display device 10 may provide a more ideal display effect.

Figure 3:
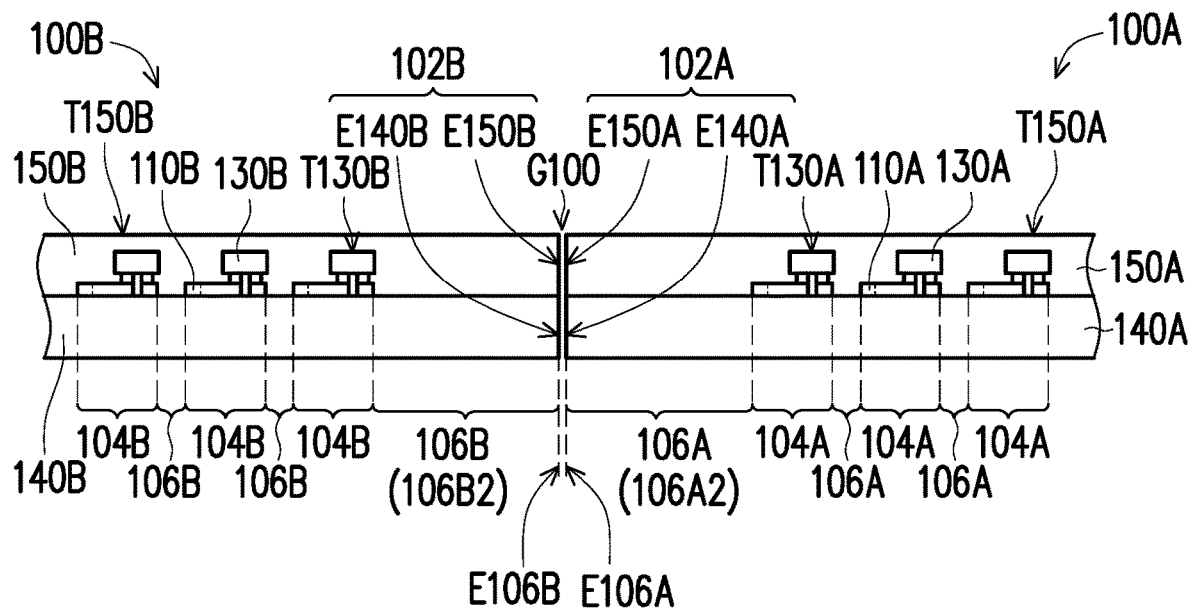
FIG. 3 to FIG. 14 show various embodiments of the cross-section of a tiled display device along line A-A of FIG. 2.

FIG. 3 shows an embodiment of the cross-section of a tiled display device along line A-A of FIG. 2. In FIG. 3, the first display panel 100A may include a first substrate 140A and a first filling layer 150A in addition to the plurality of first signal lines 110A and the plurality of first light-emitting elements 130A. The first signal lines 110A and the first light-emitting elements 130A are disposed on the first substrate 140A. According to some embodiments, the first filling layer 150A may fill the gap between the light-emitting elements 130A and cover a top surface T130A of the first light-emitting elements 130A. That is, a top surface T150A of the first filling layer 150A may be higher than the top surface T130A of the first light-emitting elements 130A, for example. The first filling layer 150A may fill the gap between the light-emitting elements 130A and may be extended to a portion other than the light-emitting elements 130A, such as extended to the first tiling edge 102A, and has an edge E150A. As shown in FIG. 3, the first signal lines 110A and the first light-emitting elements 130A may be disposed between the first substrate 140A and the first filling layer 150A. Similarly, in the second display panel 100B, the second signal lines 110B and the second light-emitting elements 130B may be disposed between a second substrate 140B and a second filling layer 150B. According to some embodiments, the second filling layer 150B may fill the gap between the light-emitting elements 130B and may cover a top surface T130B of the second light-emitting elements 130B. That is, a top surface T150B of the second filling layer 150B may be higher than the top surface T130B of the second light-emitting elements 130B, for example. The second filling layer 150B may fill the gap between the light-emitting elements 130B and may be extended to a portion other than the light-emitting elements 130B, such as extended to the second tiling edge 102B, and has an edge E150B.

According to other embodiments (although not shown), the top surface T150A of the first filling layer 150A may be the same as the top surface T130A of the first light-emitting elements 130A, for example. The top surface T150B of the second filling layer 150B may be the same as the top surface T130B of the second light-emitting elements 130B, for example.

In the present embodiment, the first substrate 140A and the second substrate 140B may be transparent. The first substrate 140A and the second substrate 140B are, for example, transparent plastic substrates, quartz substrates, or glass substrates. For example, the materials of the first substrate 140A and the second substrate 140B may each include glass, quartz, polycarbonate (PC), polyimide (PI), polyethylene terephthalate (PET), other suitable substrate materials, or a combination thereof, but is not limited thereto. The first filling layer 150A and the second filling layer 150B may be transparent, and may include a transparent encapsulation material, such as an inorganic protective layer, an organic protective layer, a laminate of an organic protective layer and an inorganic protective layer, and the like. The material of the inorganic protective layer may include silicon oxide, silicon nitride, silicon oxynitride, or similar materials. The material of the organic protective layer may include polyimide, epoxy resin, and/or other organic compounds. According to some embodiments, the first filling layer 150A and the second filling layer 150B may be ink materials, adhesive materials, encapsulation fillers, or a combination thereof.

As shown in FIG. 2 and FIG. 3, since the first substrate 140A, the second substrate 140B, the first filling layer 150A, and the second filling layer 150B may be transparent, in addition to parts other than non-transparent members (such as signal lines and light-emitting elements), the first transparent part 106A and the second transparent part 106B may be defined. In detail, the first transparent sub-part 106A2 of the first display panel 100A includes a portion of the transparent first substrate 140A and a portion of the transparent first filling layer 150A. The second transparent sub-part 106B2 of the second display panel 100B includes a portion of the transparent second substrate 140B and a portion of the transparent second filling layer 150B.

According to some embodiments, a portion of the edge E140A of the first substrate 140A is adjacent to a portion of the edge E140B of the second substrate 140B, and a portion of the edge E150A of the first filling layer 150A is adjacent to a portion of the edge E150B of the second filling layer 150B, so that the edge E140A and the edge E150A form the first tiling edge 102A, and the edge E140B and the edge E150B forms the second tiling edge 102B. The gap between the first substrate 140A and the second substrate 140B is the tiling gap G100. It may be seen from FIG. 3 that the first transparent sub-part 106A2 of the first display panel 100A is adjacent to the second transparent sub-part 106B of the second display panel 100B so that the user may not readily notice the tiling gap G100, thus helping to improve the visual effect presented by the tiled display device 10.

Figure 4:
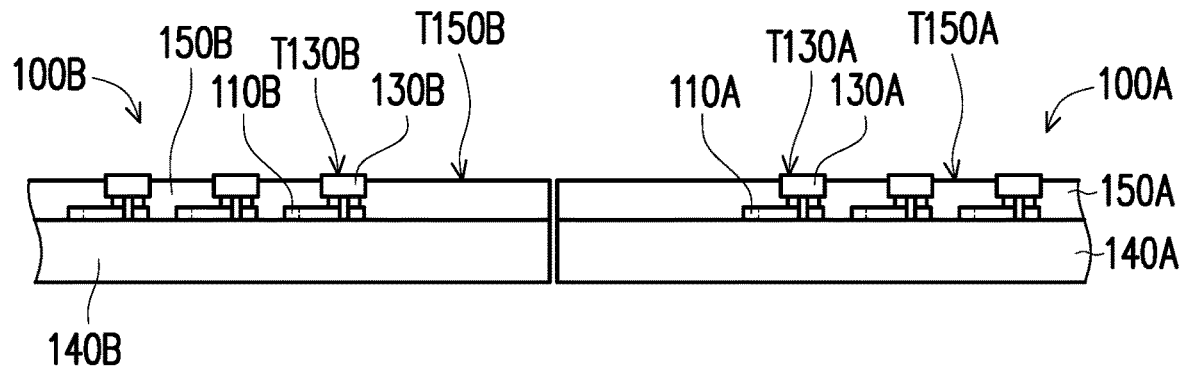

FIG. 4 shows another embodiment of the cross-section of a tiled display device along line A-A of FIG. 2. The differences between FIG. 4 and FIG. 3 are as follows. The first filling layer 150A is filled in the gap between the light-emitting elements 130A, but does not cover the top surface T130A of the light-emitting elements 130A, so that at least one light-emitting element 130A is protruded beyond the top surface T150A of the first filling layer 150A. The second filling layer 150B is filled in the gap between the light-emitting elements 130B, but does not cover the top surface T130B of the light-emitting elements 130B, so that at least one light-emitting element 130B is protruded beyond the top surface T150B of the second filling layer 150B. That is, the top surface T150A of the first filling layer 150A may be lower than the top surface T130A of the first light-emitting elements 130A, for example. The top surface T150B of the second filling layer 150B may be lower than the top surface T130B of the second light-emitting elements 130B, for example.

Figure 5:
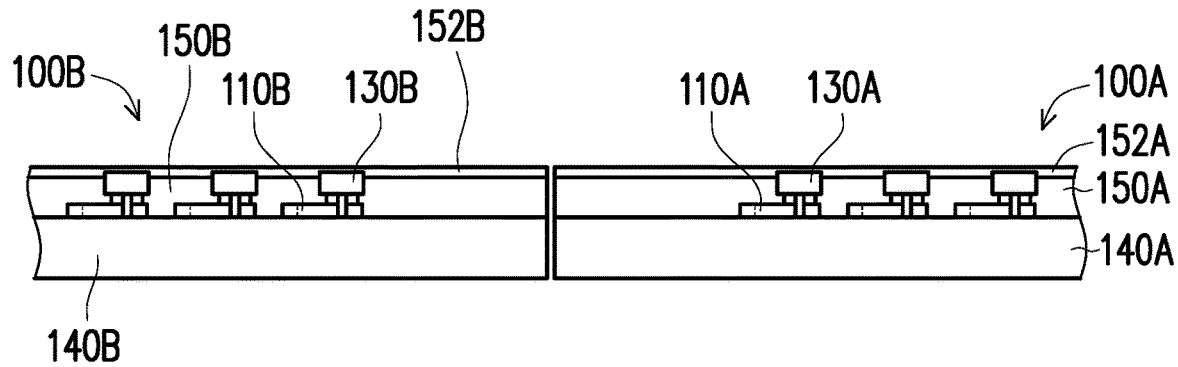

FIG. 5 shows yet another embodiment of the cross-section of a tiled display device along line A-A of FIG. 2. In FIG. 5, the present embodiment is different from the embodiment in FIG. 4 mainly in that the first display panel 100A further includes a first encapsulation layer 152A, and the second display panel 100B further includes a second encapsulation layer 152B. In the first display panel 100A, the first encapsulation layer 152A is disposed on the first filling layer 150A and the first light-emitting elements 130A. Therefore, the first light-emitting elements 130A and the first filling layer 150A are disposed between the first encapsulation layer 152A and the first substrate 140A. In the second display panel 100B, the second encapsulation layer 152B is disposed on the second filling layer 150B and the second light-emitting elements 130B. Therefore, the second light-emitting elements 130B and the second filling layer 150B are sandwiched between the second encapsulation layer 152B and the second substrate 140B. The first encapsulation layer 152A and the second encapsulation layer 152B may include a transparent encapsulation material, such as an inorganic protective layer, an organic protective layer, a laminate of an organic protective layer and an inorganic protective layer, and the like. The material of the inorganic protective layer may include silicon oxide, silicon nitride, silicon oxynitride, or similar materials. The material of the organic protective layer may include polyimide, epoxy resin, and/or other organic compounds.

Figure 6:
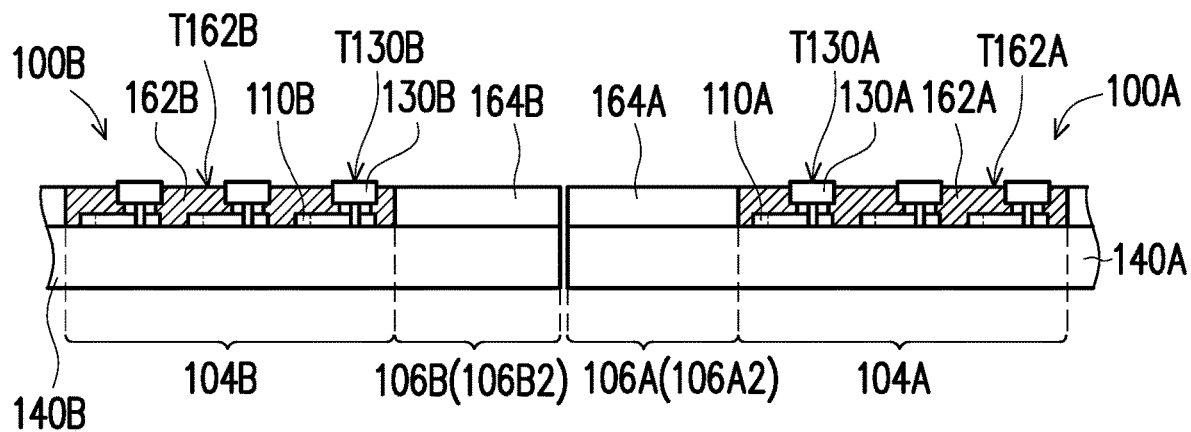

FIG. 6 shows still yet another embodiment of the cross-section of a tiled display device along line A-A of FIG. 2. The differences between FIG. 6 and FIG. 3 are as follows. In the first display panel 100A, the gap between the light-emitting elements 130A is filled by a first light-shielding filling layer 162A, but the first light-shielding filling layer 162A is not extended to the first tiling edge 102A. The first light-shielding filling layer 162A may surround the peripheral edge of the first light-emitting elements 130A. The first transparent sub-part 106A2 may include a first transparent filling layer 164A. The first transparent filling layer 164A may be disposed at the edge of the first light-shielding filling layer 162A, and may be extended to the first tiling edge 102A. The first light-shielding filling layer 162A may be an opaque member. Therefore, the first light-shielding filling layer 162A may define the first non-transparent part 104A, and the first transparent filling layer 164A may define the first transparent part 106A. In some embodiments, the first light-shielding filling layer 162A may further cover the first signal lines 110A.

Similarly, in the second display panel 100B, the gap between the light-emitting elements 130B is filled by a second light-shielding filling layer 162B, but the second light-shielding filling layer 162B is not extended to the second tiling edge 102B. The second light-shielding filling layer 162B may surround the peripheral edge of the first light-emitting elements 130B. The second transparent sub-part 106B2 may include a second transparent filling layer 164B. The second transparent filling layer 164B may be disposed at the edge of the second light-shielding filling layer 162B, and may be extended to the second tiling edge 102B. The second light-shielding filling layer 162B is an opaque member. Therefore, the second light-shielding filling layer 162B may define the second non-transparent part 104B, and the second transparent filling layer 164B may define the second transparent part 106B. In some embodiments, the second light-shielding filling layer 162B may further cover the second signal lines 110B.

As described above, the transparent parts of the display panels are respectively disposed close to the tiling edges. Specifically, the first transparent part 106A of the first display panel 100A includes the first transparent filling layer 164A, and the second transparent part 106B of the second display panel 100B includes the second transparent filling layer 164B. In this way, the user does not readily notice the tiled structure and the tiling gap when viewing the tiled display device 10. Therefore, the tiled display device 10 may provide an ideal display effect.

The materials of the first light-shielding filling layer 162A and the second light-shielding filling layer 162B include light-shielding insulating materials, such as black, white, and gray photoresist materials, inks, and filling materials. As shown in FIG. 6, a top surface T162A of the first light-shielding filling layer 162A may be lower than the top surface T130A of the first light-emitting elements 130A, and a top surface T162B of the second light-shielding filling layer 162B may be lower than the top surface T130B of the second light-emitting elements 130B, but are not limited thereto. In other embodiments (although not shown), the top surface T162A of the first light-shielding filling layer 162A may be equal to or higher than the top surface T130A of the first light-emitting elements 130A. Similarly, although not shown, the top surface T162B of the second light-shielding filling layer 162B may be equal to or higher than the top surface T130B of the second light-emitting elements 130B.

The materials of the first transparent filling layer 164A and the second transparent filling layer 164B are, for example, transparent materials, which may include transparent photoresists, transparent ink materials, transparent adhesive materials, transparent encapsulation fillers, and the like. A top surface T164A of the first transparent filling layer 164A may be lower than, equal to, or higher than the first light-emitting elements 130A, and a top surface T164B of the second transparent filling layer 164B may be lower than, equal to, or higher than the second light-emitting elements 130B. In addition, the first light-shielding filling layer 162A and the second light-shielding filling layer 162B may be aligned with the first transparent filling layer 164A and the second transparent filling layer 164B, but are not limited thereto.

Figure 7:
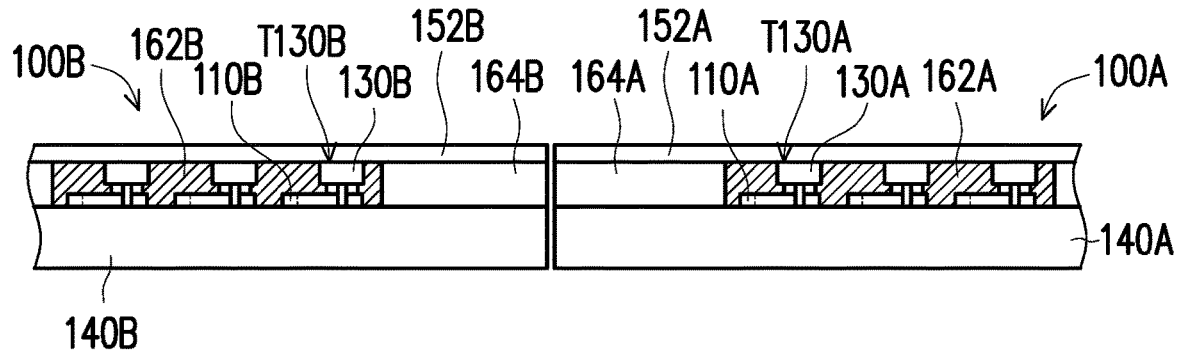

FIG. 7 shows still yet another embodiment of the cross-section of a tiled display device along line A-A of FIG. 2. FIG. 7 is similar to FIG. 6 with the following differences. The first light-shielding filling layer 162A may be filled in the gap between the light-emitting elements 130A, but the top surface T162A of the first light-shielding filling layer 162A may be equal to the top surface T130A of the first light-emitting elements 130A, and the top surface T162B of the second light-shielding filling layer 162B may be equal to the top surface T130B of the second light-emitting elements 130B. Moreover, the first display panel 100A further includes the first encapsulation layer 152A disposed on the first light-shielding filling layer 162A, the first light-emitting elements 130A, and the first transparent filling layer 164A. The second display panel 100B further includes the second encapsulation layer 152B disposed on the second light-shielding filling layer 162B, the second light-emitting elements 130B, and the second transparent filling layer 164B.

Figure 8:
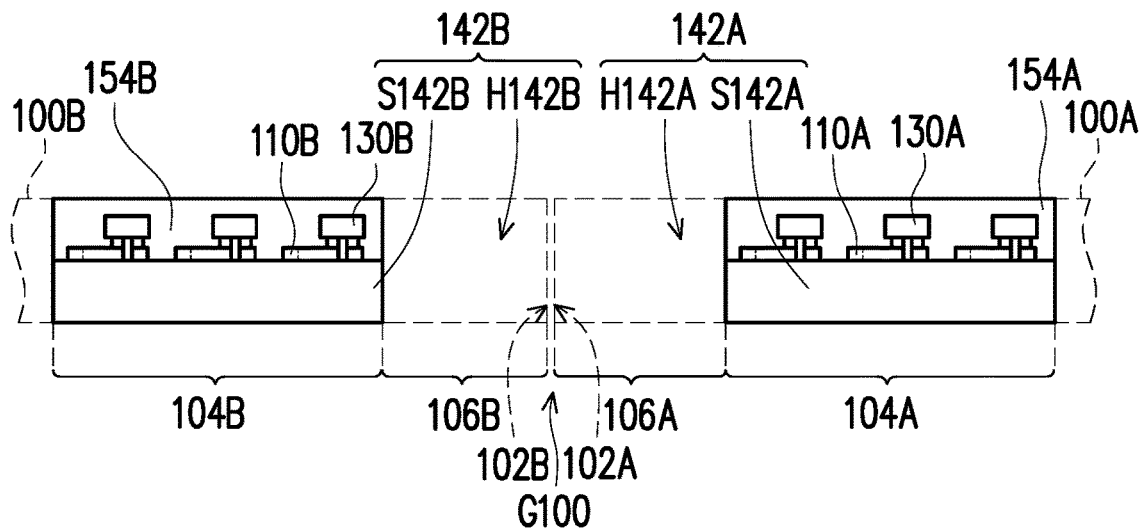

FIG. 8 shows yet another embodiment of the cross-section of a tiled display device along line A-A of FIG. 2. In FIG. 8, the first display panel 100A includes a first patterned substrate 142A and a first patterned encapsulation layer 154A in addition to the plurality of first signal lines 110A and the plurality of first light-emitting elements 130A. The second display panel 100B includes a second patterned substrate 142B and a second patterned encapsulation layer 154B in addition to the plurality of second signal lines 110B and the plurality of second light-emitting elements 130B.

In FIG. 8, the first patterned substrate 142A of the first display panel 100A may be, for example, a non-transparent substrate. For example, the first patterned substrate 142A may be a printed circuit board. The first patterned substrate 142A may be patterned by cutting, drilling, film forming, stamping, etc., and has a grid-like structure in the top view (not shown). In addition to a solid part S142A, the first patterned substrate 142A may also have a hollow part H142A. The first signal lines 110A, the first light-emitting elements 130A, and the first patterned encapsulation layer 154A are disposed on the solid part S142A of the first patterned substrate 142A. The solid part S142A of the first patterned substrate 142A defines the first non-transparent part 104A of the first display panel 100A. The hollow part H142A may define the first transparent part 106A of the first display panel 100A. The first patterned encapsulation layer 154A may be substantially distributed along the solid part S142A and has the same grid-like structure as the first patterned substrate 142A in the top view (not shown).

The second patterned substrate 142B also has, for example, a solid part S142B and a hollow part H142B, wherein in the top view (not shown), the solid part S142B may, for example, have a grid-like structure and be distributed around the hollow part H142B. The second signal lines 110B, the second light-emitting elements 130B, and the second patterned encapsulation layer 154B are disposed on the solid part S142B of the second patterned substrate 142B. In this way, the hollow part H142B of the second patterned substrate 142B defines the second transparent part 106B, and the solid part S142B of the second patterned substrate 142B defines the second non-transparent part 104B. At least a portion of the hollow part H142B, as shown in FIG. 8, is located at the edge of the second display panel 100B and adjacent to the hollow part H142A of the first display panel 100A. Therefore, the first transparent part 106A of the first display panel 100A and the second transparent part 106B of the second display panel 100B are closely adjacent to each other, making it difficult for the user to notice the tiling gap G100 between the first display panel 100A and the second display panel 100B.

Figure 9:
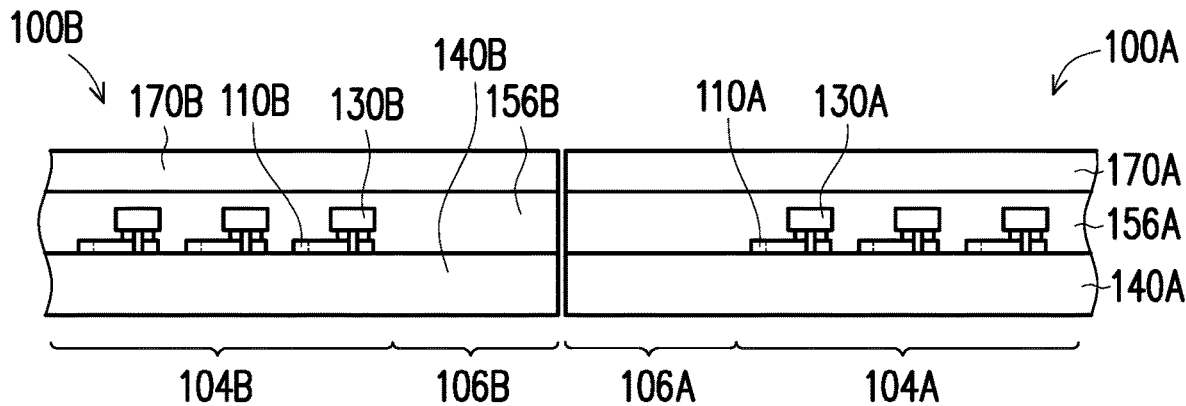

FIG. 9 shows still yet another embodiment of the cross-section of a tiled display device along line A-A of FIG. 2. In the present embodiment, the first display panel 100A includes a first counter substrate 170A in addition to the members shown in FIG. 3, and the second display panel 100B includes a second counter substrate 170B in addition to the members shown in FIG. 3. Therefore, in the present embodiment, the first display panel 100A and the second display panel 100B are implemented with a dual-substrate display panel structure.

In FIG. 9, the first display panel 100A includes the first counter substrate 170A and a first encapsulation layer 156A in addition to the plurality of first signal lines 110A, the plurality of first light-emitting elements 130A, and the first substrate 140A. The first counter substrate 170A and the first substrate 140A are opposite to each other, and the first signal lines 110A, the first light-emitting elements 130A, and the first encapsulation layer 156A are disposed between the first substrate 140A and the first counter substrate 170A. The first encapsulation layer 156A is disposed between the first substrate 140A and the first counter substrate 170A and covers the first light-emitting elements 130A. In addition to covering the first light-emitting elements 130A, the first encapsulation layer 156A also provides adhesive properties to bond the first counter substrate 170A onto the first substrate 140A.

The second display panel 100B includes the second counter substrate 170B and a second encapsulation layer 156B in addition to the plurality of second signal lines 110B, the plurality of second light-emitting elements 130B, and the second substrate 140B. The second counter substrate 170B and the second substrate 140B are opposite to each other, and the second signal lines 110B, the second light-emitting elements 130B, and the second encapsulation layer 156B are disposed between the second substrate 140B and the second counter substrate 170B. In addition to covering the second light-emitting elements 130B, the second encapsulation layer 156B also provides adhesive properties to bond the second counter substrate 170B onto the second substrate 140B.

The materials of the first encapsulation layer 156A and the second encapsulation layer 156B include optical clear adhesives (OCA), optical clear resins (OCR), or other similar materials. The first counter substrate 170A and the second counter substrate 170B are, for example, transparent substrates. The first counter substrate 170A and the second counter substrate 170B are, for example, transparent plastic substrates, quartz substrates, or glass substrates. For example, the materials of the first counter substrate 170A and the second counter substrate 170B may each include glass, quartz, polycarbonate (PC), polyimide (PI), polyethylene terephthalate (PET), other suitable substrate materials, or a combination thereof, but are not limited thereto. In some embodiments, the first substrate 140A and the first counter substrate 170A may be the same material, and the second substrate 140B and the second counter substrate 170B may be the same material, but are not limited thereto.

Figure 10:
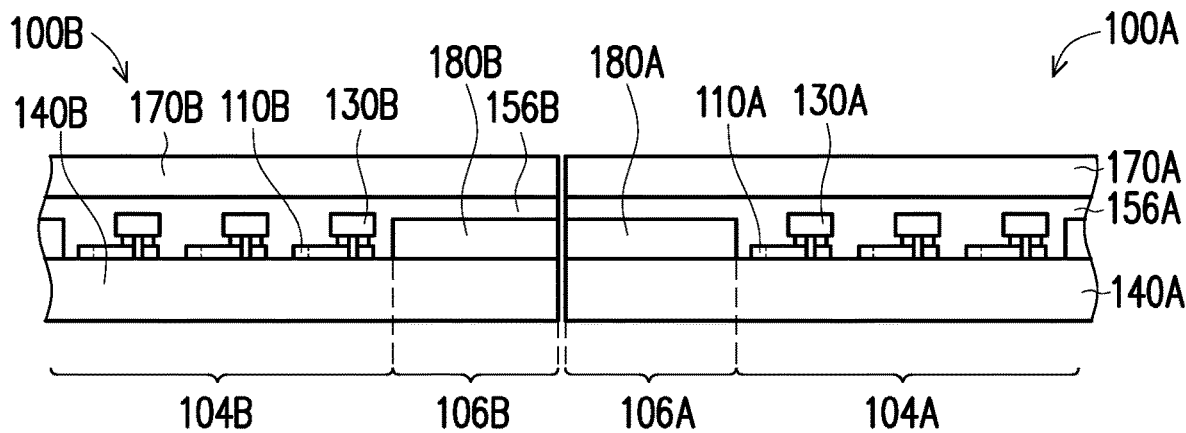

FIG. 10 shows yet another embodiment of the cross-section of a tiled display device along line A-A of FIG. 2. In the present embodiment, the first display panel 100A includes a first transparent layer 180A in addition to the members shown in FIG. 9, and the second display panel 100B includes a second transparent layer 180B in addition to the members shown in FIG. 9. In the present embodiment, the first transparent layer 180A is located in the first transparent part 106A of the first display panel 100A, and the second transparent layer 180B is located in the second transparent part 106B of the second display panel 100b. A portion of the first transparent layer 180A is extended to the edge of the first display panel 100A, a portion of the second transparent layer 180B is extended to the edge of the second display panel 100B, and this part of the first transparent layer 180A is adjacent to this portion of the second transparent layer 180B. In this way, the first transparent part 106A and the second transparent part 106B are adjacent to each other, which helps the user to not readily notice the tiling between the first display panel 100A and the second display panel 100B.

The materials of the first transparent layer 180A and the second transparent layer 180B include transparent photoresists, transparent inks, or other similar materials. The first encapsulation layer 156A may cover the first transparent layer 180A so that the first transparent layer 180A is located between the first encapsulation layer 156A and the first substrate 140A. The second encapsulation layer 156B may also cover the second transparent layer 180B. In this way, the first counter substrate 170A may be attached to the first substrate 140A by the first encapsulation layer 156A, and the second counter substrate 170B may be attached to the second substrate 140B by the second encapsulation layer 156B.

Figure 11:
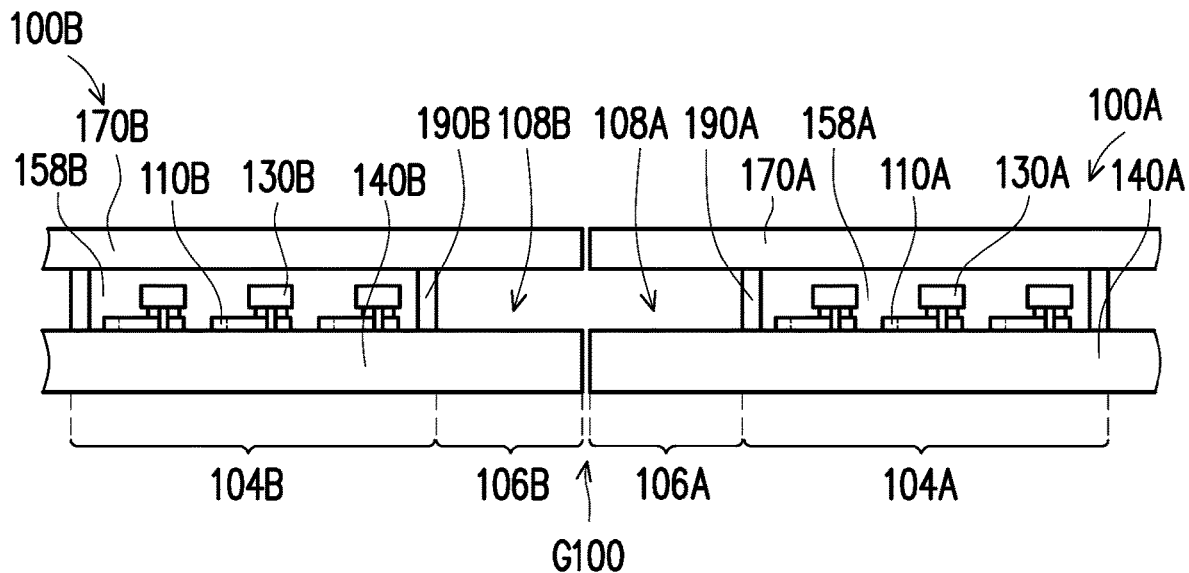

FIG. 11 shows still yet another embodiment of the cross-section of a tiled display device along line A-A of FIG. 2. In the present embodiment, the first display panel 100A includes the first signal lines 110A, the first light-emitting elements 130A, the first substrate 140A, a first encapsulation layer 158A, the first counter substrate 170A, and a first pattern definition layer 190A. The second display panel 100B includes the second signal lines 110B, the second light-emitting elements 130B, the second substrate 140B, a second encapsulation layer 158B, the second counter substrate 170B, and a second pattern definition layer 190B.

In the first display panel 100A of the present embodiment, the first pattern definition layer 190A may surround three first light-emitting elements 130A to define one display pixel, wherein the three first light-emitting elements 130A in the area surrounded by the first pattern definition layer 190A may have different colors, such as red light-emitting elements, green light-emitting elements, and blue light-emitting elements, but the disclosure is not limited thereto. In other embodiments, one, two, or more than three first light-emitting elements 130A may be disposed in the area surrounded by the first pattern definition layer 190A. The first encapsulation layer 158A may be disposed in the area surrounded by the first pattern definition layer 190A to cover the first light-emitting elements 130A. In addition, the first substrate 140A and the first counter substrate 170A have, for example, a first interval space 108A in an area other than the first pattern definition layer 190A. In some embodiments, the first interval space 108A may be filled with gas, such as air, nitrogen, inert gas, etc., or be in a vacuum state.

The second display panel 100B of the present embodiment has a design similar to that of the first display panel 100A. The second pattern definition layer 190B may surround three second light-emitting elements 130B to define one display pixel, wherein the three second light-emitting elements 130B in the area surrounded by the second pattern definition layer 190B may have different colors, such as red, green, and blue, but the disclosure is not limited thereto. The second encapsulation layer 158B may be disposed in the area surrounded by the second pattern definition layer 190B to cover the second light-emitting elements 130B. In addition, the second substrate 140B and the second counter substrate 170B have, for example, a second interval space 108B in an area other than the second pattern definition layer 190B. In some embodiments, the second interval space 108B may be filled with gas, such as air, nitrogen, inert gas, etc., or be in a vacuum state.

In the present embodiment, the first pattern definition layer 190A and the second pattern definition layer 190B are illustrated using a non-transparent material as an example. The first transparent part 106A of the first display panel 100A includes at least the first interval space 108A, and the second transparent part 106B of the second display panel 100B includes at least the second interval space 108B. As shown in FIG. 11, at the tiling gap G100 between the first display panel 100A and the second display panel 100B, at least a portion of the first interval space 108A and at least a portion of the second interval space 108B are adjacent to each other. In this way, the design in which the first transparent part 106A and the second transparent part 106B are adjacent to each other may make the tiling of the first display panel 100A and the second display panel 100B not readily noticeable.

Figure 12:
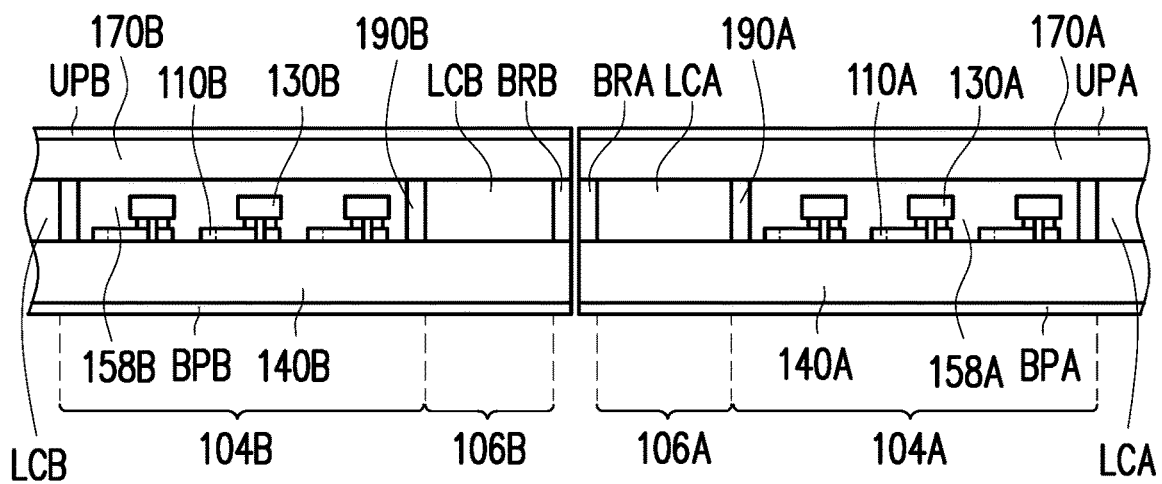

FIG. 12 shows yet another embodiment of the cross-section of a tiled display device along line A-A of FIG. 2. In the present embodiment, in addition to the members shown in FIG. 11, the first display panel 100A further includes a first sealing layer BRA, a first dye liquid crystal layer LCA, a first upper polarizing layer UPA, and a first lower polarizing layer BPA, and in addition to the members shown in FIG. 11, the second display panel 100B further includes a second sealing layer BRB, a second dye liquid crystal layer LCB, a second upper polarizing layer UPB, and a second lower polarizing layer BPB. In the present embodiment, the first sealing layer BRA may include the same material as the first pattern definition layer 190A, but is not limited thereto. The first sealing layer BRA may be transparent or non-transparent, and is disposed along the edge of the first display panel 100A. The first sealing layer BRA is disposed between the first substrate 140A and the first counter substrate 170A, and the first sealing layer BRA may be aligned with a side of the first substrate 140A and a side of the first counter substrate 170A. The first dye liquid crystal layer LCA is disposed between the first substrate 140A and the first counter substrate 170A and located between the first sealing layer BRA and the first pattern definition layer 190A. The first upper polarizing layer UPA is disposed at the outer side of the first counter substrate 170A (that is, the side away from the first light-emitting elements 130A), and the first lower polarizing layer BPA is disposed at the outer side of the first substrate 140A (that is, the side away from the first light-emitting elements 130A). In the present embodiment, for example, the first dye liquid crystal layer LCA is located in the first transparent part 106A, and the polarization directions of the first upper polarizing layer UPA and the first lower polarizing layer BPA may match the first dye liquid crystal layer LCA to allow light, such as visible light, to pass.

The arrangement relationship of the second sealing layer BRB, the second dye liquid crystal layer LCB, the second upper polarizing layer UPB, and the second lower polarizing layer BPB is roughly similar to the first sealing layer BRA, the first dye liquid crystal layer LCA, the first upper polarizing layer UPA, and the first lower polarizing layer BPA. The second dye liquid crystal layer LCB is disposed between the second substrate 140B and the second counter substrate 170B and sealed between the second pattern definition layer 190B and the second sealing layer BRB. For example, the second dye liquid crystal layer LCB is located in the second transparent part 106B, and the polarization directions of the second upper polarizing layer UPB and the second lower polarizing layer BPB may match the second dye liquid crystal layer LCB to allow light, such as visible light, to pass. In some embodiments, the materials of the first dye liquid crystal layer LCA and the second dye liquid crystal layer LCB include dichroic liquid crystal materials, but are not limited thereto.

Figure 13:
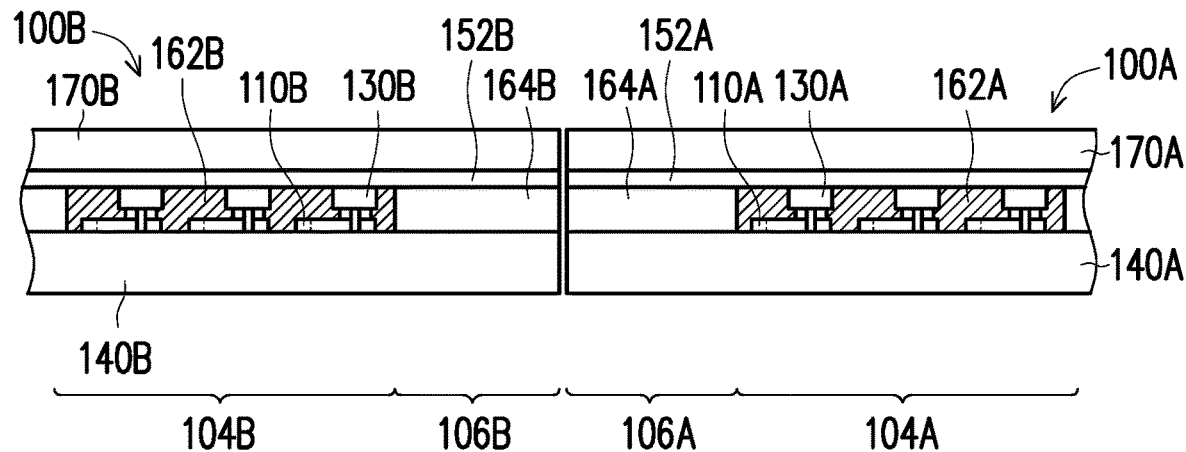

FIG. 13 shows still yet another embodiment of the cross-section of a tiled display device along line A-A of FIG. 2.

The first display panel 100A of the present embodiment includes the first counter substrate 170A in addition to the members shown in FIG. 6, and the second display panel 100B includes the second counter substrate 170B in addition to the members shown in FIG. 6. The first signal lines 110A, the first light-emitting elements 130A, the first encapsulation layer 152A, the first light-shielding filling layer 162A, and the first transparent filling layer 164A are disposed between the first substrate 140A and the first counter substrate 170A. The second signal lines 110B, the second light-emitting elements 130B, the second encapsulation layer 152B, the second light-shielding filling layer 162B, and the second transparent filling layer 164B are disposed between the second substrate 140B and the second counter substrate 170B. Therefore, in the present embodiment, the first display panel 100A and the second display panel 100B are implemented with a dual-substrate display panel structure.

The first counter substrate 170A and the second counter substrate 170B are, for example, transparent substrates. The first counter substrate 170A and the second counter substrate 170B are, for example, transparent plastic substrates, quartz substrates, or glass substrates. For example, the materials of the first counter substrate 170A and the second counter substrate 170B may each include glass, quartz, polycarbonate (PC), polyimide (PI), polyethylene terephthalate (PET), other suitable substrate materials, or a combination thereof, but are not limited thereto. In some embodiments, the first substrate 140A and the first counter substrate 170A may be the same material, and the second substrate 140B and the second counter substrate 170B may be the same material, but are not limited thereto.

Figure 14:
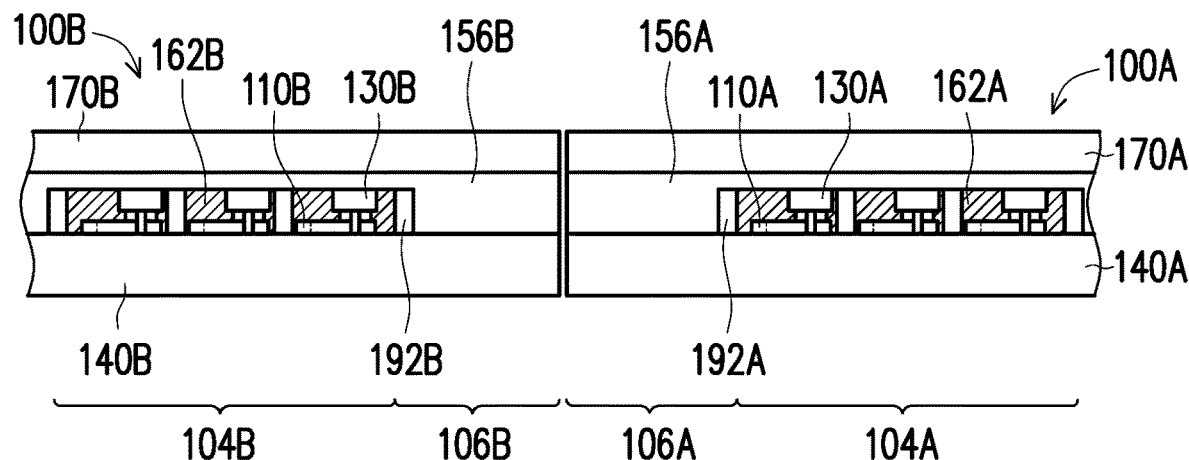

FIG. 14 shows yet another embodiment of the cross-section of a tiled display device along line A-A of FIG. 2. In the present embodiment, the first display panel 100A includes the first signal lines 110A, the first light-emitting elements 130A, the first substrate 140A, the first encapsulation layer 156A, the first light-shielding filling layer 162A, the first counter substrate 170A, and a first pattern definition layer 192A. The second display panel 100B includes the second signal lines 110B, the second light-emitting elements 130B, the second substrate 140B, the second encapsulation layer 156B, the second light-shielding filling layer 162B, the second counter substrate 170B, and a second pattern definition layer 192B.

In the first display panel 100A of the present embodiment, the first pattern definition layer 192A may surround a single first light-emitting element 130A, and the first light-shielding filling layer 162A is filled in the area surrounded by the first pattern definition layer 192A to cover the first light-emitting element 130A. The first encapsulation layer 156A is disposed between the first substrate 140A and the first counter substrate 170A, and covers the first pattern definition layer 192A, the first light-shielding filling layer 162A, and the first light-emitting element 130A. In the second display panel 100B of the present embodiment, the second pattern definition layer 192B surrounds a single second light-emitting element 130B, and the second light-shielding filling layer 162B is filled in the area surrounded by the second pattern definition layer 192B and covers the second light-emitting element 130B. The second encapsulation layer 156B is disposed between the second substrate 140B and the second counter substrate 170B, and covers the second pattern definition layer 192B, the second light-shielding filling layer 162B, and the second light-emitting element 130B.

Figure 15:
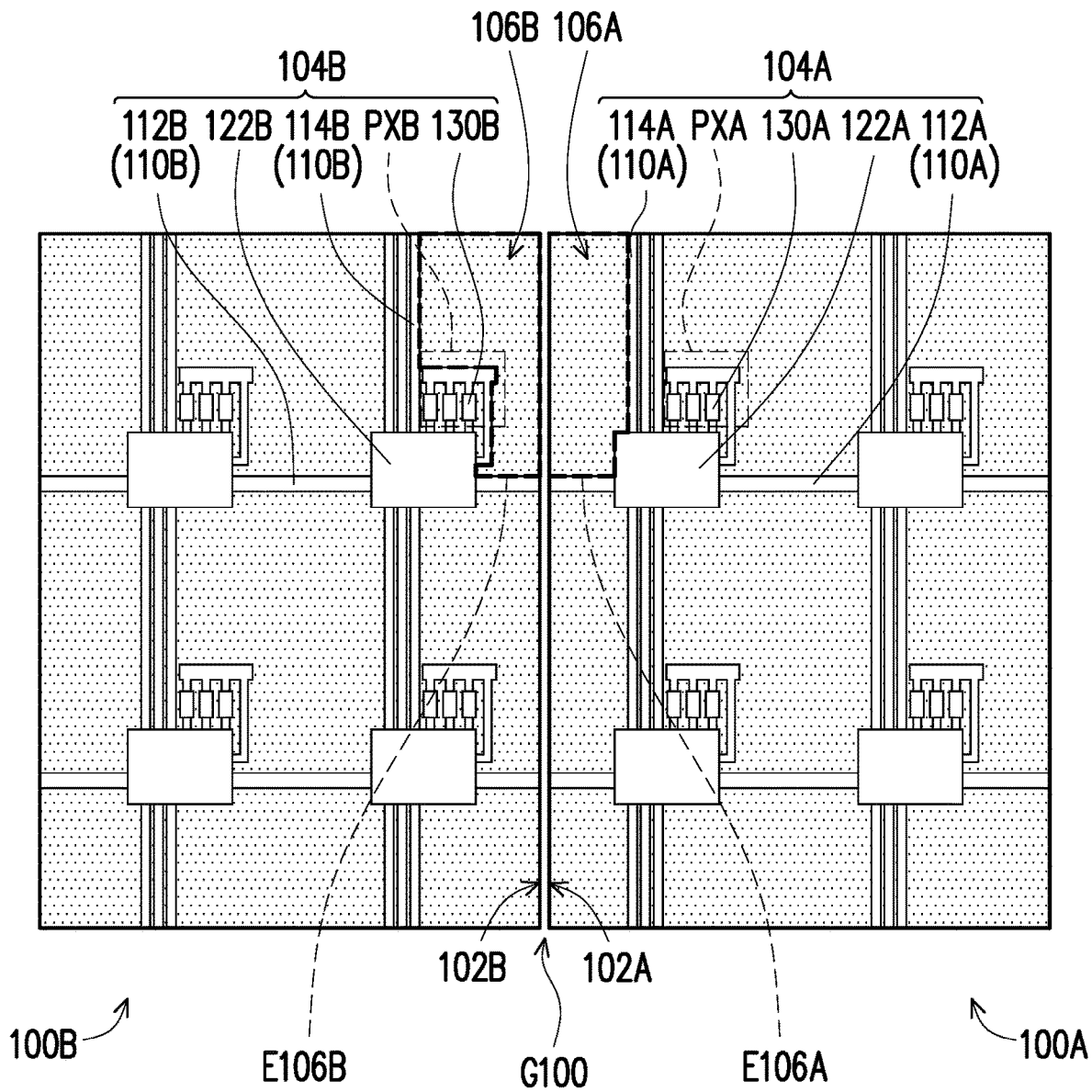
FIG. 15 schematically shows another embodiment of the area E of the tiled display device 10.

FIG. 15 schematically shows another embodiment of the area E of the tiled display device 10 shown in FIG. 1. In FIG. 15, the first display panel 100A includes the plurality of first signal lines 110A, a plurality of first pixel circuits 122A, and the plurality of first light-emitting elements 130A. The first pixel circuits 122A may be electrically connected to the first signal lines 110A, and are used to transmit the signal needed by the first light-emitting elements 130A to the first light-emitting elements 130A. The first pixel circuits 122A may be electrically connected to the first signal lines 110A, and the light-emitting elements 130A may be driven by the first pixel circuits 122A. The arrangement of the first signal lines 110A, the first pixel circuits 122A, and the first light-emitting elements 130A may be used to achieve image display function. Specifically, in the present embodiment, three first light-emitting elements 130A form one light-emitting pixel PXA as an example. The first pixel circuits 122A may include micro integrated circuits, and the three first light-emitting elements 130A of a single light-emitting pixel PXA may be connected to one first pixel circuit 122A. The first signal lines 110A of the present embodiment may include a plurality of scan lines 112A and a plurality of data lines 114A, and the first pixel circuits 122A may be connected to one of the scan lines 112A and three of the data lines 114A. The signals transmitted by the three data lines 114A, for example, can correspondingly control the luminous brightness of three first light-emitting elements 130A, respectively. The first pixel circuits 122A and the first light-emitting elements 130A may be disposed in the first display panel 100A by bonding. The first signal lines 110A, the first pixel circuits 122A, and the first light-emitting elements 130A are non-transparent members. Therefore, the first non-transparent part 104A may include the first signal lines 110A, the first pixel circuits 122A, and the first light-emitting elements 130A, and the first transparent part 106A may be a part other than the first signal lines 110A, the first pixel circuits 122A, and the first light-emitting elements 130A. The detailed structure of the elements in the first display panel 100A and the connection relationship between the elements are as provided in the related description of the first display panel 100A in FIG. 2 and FIG. 3, and are not repeated herein.

The second display panel 100B includes the plurality of second signal lines 110B, a plurality of second pixel circuits 122B, and the plurality of second light-emitting elements 130B, wherein every three second light-emitting elements 130B may be connected to one second pixel circuit 122B to form one light-emitting pixel PXB. The second pixel circuits 122B may be electrically connected to the second signal lines 110B, and the light-emitting elements 130B may be driven by the second pixel circuits 122B. The second non-transparent part 104B includes the second signal lines 110B, the second pixel circuits 122B, and the second light-emitting elements 130B, and the second transparent part 106B is a part other than the second non-transparent part 104B. The detailed structure of the elements in the second display panel 100B and the connection relationship between the elements are similar to the first display panel 100A and are not repeated herein. In some embodiments, the structure of any of FIG. 3 to FIG. 14 or other alternative structures may be applicable to the cross-sectional structural designs of the first display panel 100A and the second display panel 100B. In other words, the first display panel 100A and the second display panel 100B of FIG. 15 may have a single substrate structure or a dual substrate structure, and may further include an encapsulation layer, a filling layer, a pattern definition layer, a dye liquid crystal layer, and other members.

According to some embodiments, with the structure of FIG. 15, the transparent parts of the display panels are disposed close to the tiling edges. Specifically, at least a portion of the first peripheral edge E106A of the first transparent part 106A of the first display panel 100A is overlapped with the first tiling edge 102A. According to some embodiments, at least a portion of the second peripheral edge E106B of the second transparent part 106B of the second display panel 100B is overlapped with the second tiling edge 102B. In this way, the user does not readily notice the tiled structure and the tiling gap when viewing the tiled display device 10. Therefore, the tiled display device 10 may provide an ideal display effect.

Figure 16:
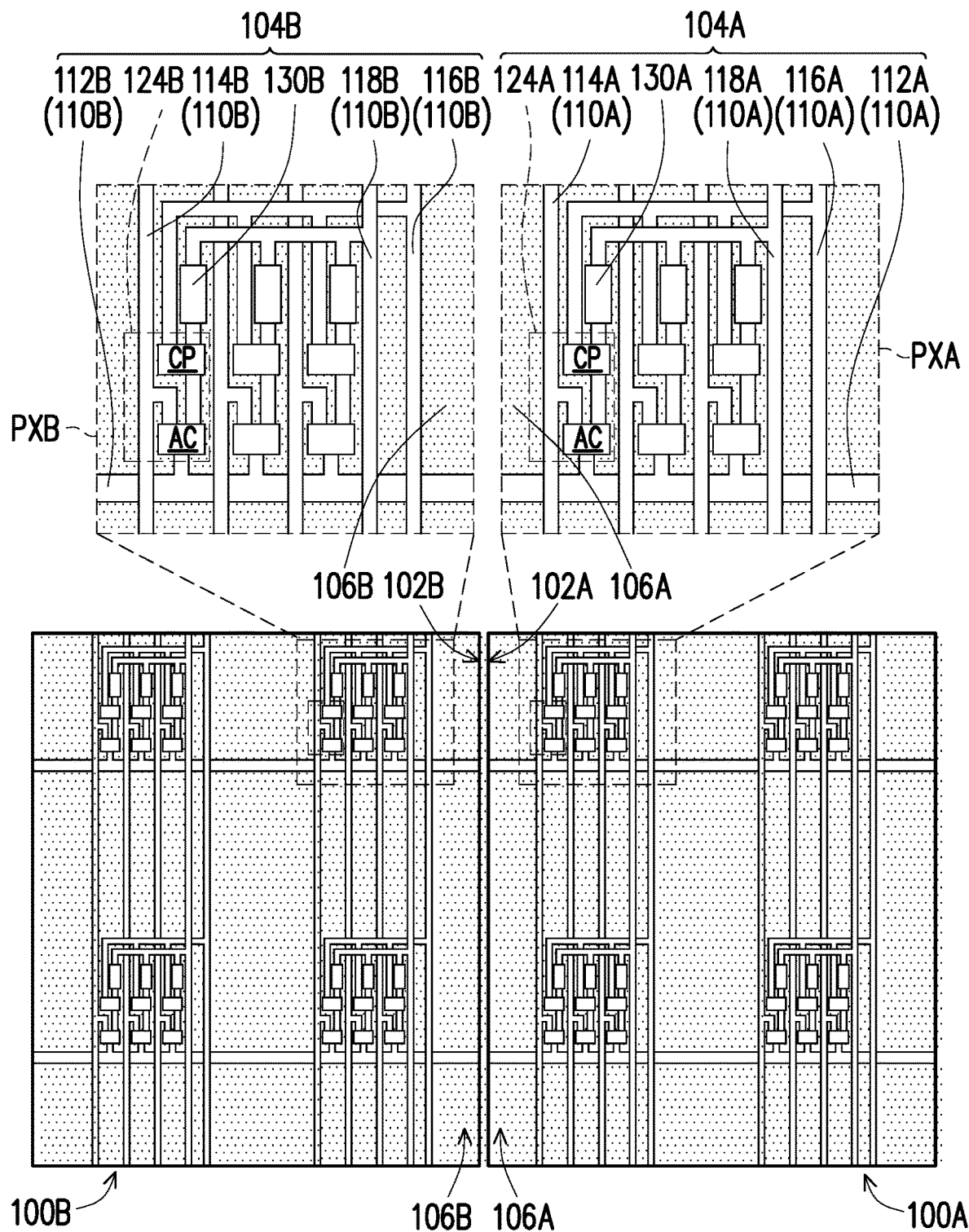
FIG. 16 schematically shows yet another embodiment of the area E of the tiled display device 10.

FIG. 16 schematically shows yet another embodiment of the area E of the tiled display device 10 shown in FIG. 1. In FIG. 16, the first display panel 100A includes the plurality of first signal lines 110A, a plurality of first pixel circuits 124A, and the plurality of first light-emitting elements 130A, wherein the first light-emitting elements 130A are, for example, light-emitting diode elements. The arrangement of the first signal lines 110A, the first pixel circuits 124A, and the first light-emitting elements 130A may be used to achieve image display function. The first pixel circuits 124A may be electrically connected to the first signal lines 110A, and the light-emitting elements 130A may be driven by the first pixel circuits 124A. Specifically, in the present embodiment, the first light-emitting elements 130A are connected to one of the first pixel circuits 124A, and three first light-emitting elements 130A and corresponding three first pixel circuits 124A form one light-emitting pixel PXA as an example. The first pixel circuits 124A may be active circuit structures including, for example, at least one active element AC (such as a transistor) and at least one capacitor CP. The first signal lines 110A of the present embodiment may include the plurality of scan lines 112A, the plurality of data lines 114A, a plurality of power lines 116A, and a plurality of power lines 118A. The active element AC in the first pixel circuits 124A may be electrically connected to one of the scan lines 112A, one of the data lines 114A, and the capacitor CP. One end of the capacitor CP in the first pixel circuits 124A may be connected to the active element AC, and the other end thereof may be connected to the power lines 116A. One end of the first light-emitting elements 130A may be connected to the capacitor CP, and the other end thereof may be connected to the power lines 118A. The first signal lines 110A, the first pixel circuits 124A, and the first light-emitting elements 130A are non-transparent members. Therefore, the first non-transparent part 104A may include the first signal lines 110A, the first pixel circuits 124A, and the first light-emitting elements 130A, and the first transparent part 106A is a part other than the first signal lines 110A, the first pixel circuits 124A, and the first light-emitting elements 130A. The power lines 116A and the power lines 118A may be VDD or VSS signal lines, but are not limited thereto. According to some embodiments, the power lines 116A and the power lines 118A may be different layers. According to some embodiments, at least a portion of the first pixel circuits 124A may be made of the same film layer as the first signal lines 110A, but is not limited thereto. For example, at least a portion of the first pixel circuits 124A may be the same layer as the scan lines 112A, and at least another part of the first pixel circuits 124A may be the same layer as the data lines 114A, but are not limited thereto.

The second display panel 100B of the present embodiment has a structure substantially similar to that of the first display panel 100A. The second display panel 100B includes the plurality of second signal lines 110B, a plurality of second pixel circuits 124B, and the plurality of second light-emitting elements 130B, wherein the second light-emitting elements 130B are, for example, light-emitting diode elements, and the second signal lines 110B may include a plurality of scan lines 112B, a plurality of data lines 114B, a plurality of power lines 116B, and a plurality of power lines 118B, for example. The second pixel circuits 124B may be electrically connected to the first signal lines 110A, and the light-emitting elements 130B may be driven by the second pixel circuits 124B. The second light-emitting elements 130B may be connected to one second pixel circuit 124B, and three second light-emitting elements 130B and corresponding three second pixel circuits 124B form one light-emitting pixel PXB.

The second signal lines 110B, the second pixel circuits 124B, and the second light-emitting elements 130B define the second non-transparent part 104B, and the part other than the second non-transparent part 104B is the second transparent part 106B. The detailed structure of the elements in the second display panel 100B and the connection relationship between the elements are similar to the first display panel 100A and are not repeated herein.

In some embodiments, the structure of any of FIG. 3 to FIG. 14 or other alternative structures may be applicable to the cross-sectional structural designs of the first display panel 100A and the second display panel 100B. In other words, the first display panel 100A and the second display panel 100B of FIG. 16 may have a single substrate structure or a dual substrate structure, and may further include an encapsulation layer, a filling layer, a pattern definition layer, a dye liquid crystal layer, and other members. According to some embodiments, with the structure of FIG. 16, the transparent parts of the display panels are disposed close to the tiling edges. Specifically, at least a portion of the first peripheral edge E106A of the first transparent part 106A of the first display panel 100A is overlapped with the first tiling edge 102A. According to some embodiments, at least a portion of the second peripheral edge E106B of the second transparent part 106B of the second display panel 100B is overlapped with the second tiling edge 102B. In this way, the user does not readily notice the tiled structure and the tiling gap when viewing the tiled display device 10. Therefore, the tiled display device 10 may provide an ideal display effect.

Figure 17:
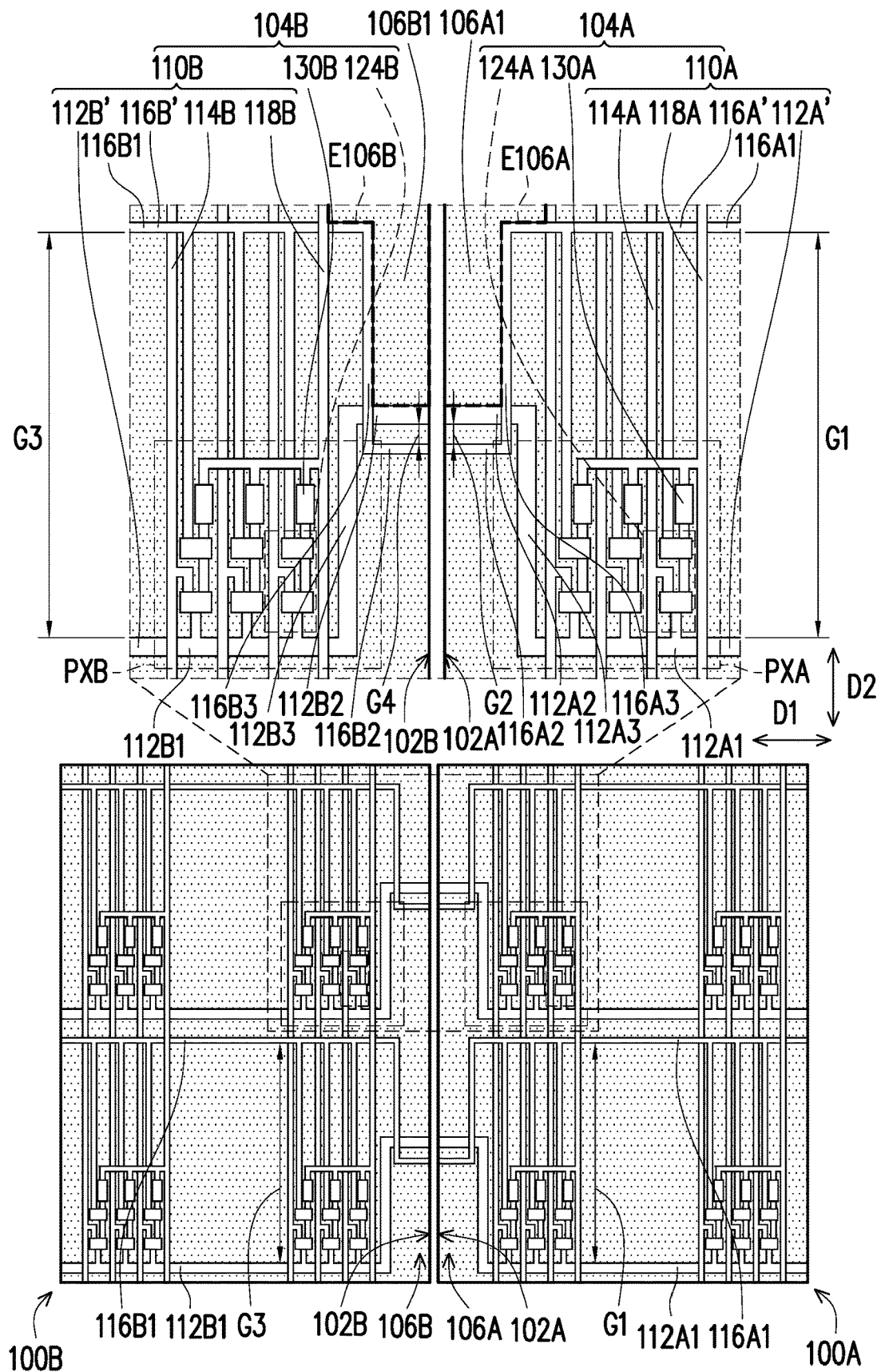
FIG. 17 schematically shows still yet another embodiment of the area E of the tiled display device 10.

FIG. 17 schematically shows still yet another embodiment of the area E of the tiled display device 10 shown in FIG. 1. In FIG. 17, the first display panel 100A includes the plurality of first signal lines 110A, the plurality of first pixel circuits 124A, and the plurality of first light-emitting elements 130A, wherein in the present embodiment, the first light-emitting elements 130A are connected to one of the first pixel circuits 124A, and three first light-emitting elements 130A and corresponding three first pixel circuits 124A form one light-emitting pixel PXA as an example. The first pixel circuits 124A may be electrically connected to the second signal lines 110B, and the light-emitting elements 130A may be driven by the first pixel circuits 124A. The structural designs of the first pixel circuits 124A and the first light-emitting elements 130A are substantially the same as those of the embodiment in FIG. 16, and therefore are not repeated herein. The first signal lines 110A of the present embodiment may include a plurality of scan lines 112A', the plurality of data lines 114A, a plurality of power lines 116A', and the plurality of power lines 118A, wherein the layout configurations of the data lines 114A and the power lines 118A are substantially the same as the embodiment of FIG. 16 and therefore are not repeated herein.

The main extending direction of the scan lines 112A' and the power lines 116A' in the present embodiment is the first direction D1, and the first display panel 100A and the second display panel 100B are arranged side by side and tiled in the first direction D1. The scan lines 112A' include a line segment 112A1, a line segment 112A2, and a line segment 112A3. The line segment 112A1 is extended along the first direction D1. The line segment 112A2 is extended along the first direction D1 and is the end part of the scan line 112A' adjacent to the first tiling edge 102A. The line segment 112A3 is extended substantially along the second direction D2 and is connected between the line segment 112A1 and the line segment 112A2. The first direction D1 and the second direction D2 may be different, such as perpendicular to each other. The power lines 116A' include a line segment 116A1, a line segment 116A2, and a line segment 116A3. The line segment 116A1 is extended along the first direction D1. The line segment 116A2 is extended along the first direction D1 and is the end part of the power line 116A' adjacent to the first tiling edge 102A. The line segment 116A3 is extended substantially along the second direction D2 and is connected between the line segment 116A1 and the line segment 116A2. The light-emitting pixel PXA may be located between the line segment 112A1 of the scan lines 112A' and the line segment 116A1 of the power lines 116A'. Along the second direction D2, the line segment 112A1 of the scan lines 112A' and the line segment 116A1 of the power lines 116A' are separated by a spacing G1, the line segment 112A2 of the scan lines 112A' and the line segment 116A2 of the power lines 116A' are separated by a spacing G2, and the spacing G1 is greater than the spacing G2. In addition, the line segment 112A3 of the scan lines 112A' and the line segment 116A3 of the power lines 116A' may cross each other. Therefore, the line segment 112A1 of the scan lines 112A' may be located at the first side (for example, the lower side in the figures) of the line segment 116A1 of the power lines 116A', and the line segment 112A2 of the scan lines 112A' may be located at the second side (for example, the upper side in the figures) of the line segment 116A2 of the power lines 116A', but are not limited thereto. The first side and the second side are opposite sides.

The second display panel 100B includes the plurality of second signal lines 110B, the plurality of second pixel circuits 124B, and the plurality of second light-emitting elements 130B, wherein in the present embodiment, the second light-emitting elements 130B are connected to one of the second pixel circuits 124B, three second light-emitting elements 130B and corresponding three second pixel circuits 124B form one light-emitting pixel PXB as an example, and the structural designs of the second pixel circuits 124B and the second light-emitting elements 130B are substantially the same as those of the embodiment in FIG. 16, and therefore are not repeated herein. The second signal lines 110B of the present embodiment may include a plurality of scan lines 112B', the plurality of data lines 114B, a plurality of power lines 116B', and the plurality of power lines 118B, wherein the layout configurations of the data lines 114B and the power lines 118B are substantially the same as the embodiment of FIG. 16 and therefore are not repeated herein.

The main extending direction of the scan lines 112B' and the power lines 116B' in the present embodiment is the first direction D1, and the first display panel 100A and the second display panel 100B are arranged side by side and tiled in the first direction D1. Along the second direction D2, the line segment 112B1 of the scan lines 112B' and the line segment 116B1 of the power lines 116B' are separated by a spacing G3, the line segment 112B2 of the scan lines 112B' and the line segment 116B2 of the power lines 116B' are separated by a spacing G4, and the spacing G3 is greater than the spacing G4. In addition, the line segment 112B3 of the scan lines 112B' and the line segment 116B3 of the power lines 116B' may cross each other. Therefore, the line segment 112B1 of the scan lines 112B' may be located at the first side (for example, the lower side in the figures) of the line segment 116B1 of the power lines 116B', and the line segment 112B2 of the scan lines 112B' is located at the opposite second side (for example, the lower side in the figures) of the line segment 116B2 of the power lines 116B', but are not limited thereto.

In some embodiments, the structure of any of FIG. 3 to FIG. 14 or other alternative structures may be applicable to the cross-sectional structural designs of the first display panel 100A and the second display panel 100B. In other words, the first display panel 100A and the second display panel 100B of FIG. 17 may have a single substrate structure or a dual substrate structure, and may further include an encapsulation layer, a filling layer, a pattern definition layer, a dye liquid crystal layer, and other members. According to some embodiments, with the structure of FIG. 17, the transparent parts of the display panels are disposed near the tiling edges. Specifically, although in FIG. 17, a portion of the first non-transparent part 104A is extended to the first tiling edge 102A. For example, the line segment 112A2 of the scan lines 112A' and the line segment 116A2 of the power lines 116A' are extended to the first tiling edge 102A. A portion of the second non-transparent part 104B is extended to the second tiling edge 102B. For example, the line segment 112B2 of the scan lines 112B' and the line segment 116B2 of the power lines 116B' are extended to the first tiling edge 102A. However, in the first display panel 100A, the transparent part 106A is still at least partially overlapped with the first tiling edge 102A. For example, at least a portion of the first peripheral edge E106A of the first transparent sub-part 106A1 of the second display panel 100A is overlapped with the first tiling edge 102A. In the second display panel 100B, the second transparent part 106B is still at least partially overlapped with the second tiling edge 102B. For example, at least a portion of the second peripheral edge E106B of the second transparent sub-part 106B1 of the second display panel 100B is overlapped with the second tiling edge 102B. In this way, the user does not readily notice the tiled structure and the tiling gap when viewing the tiled display device 10. Therefore, the tiled display device 10 may provide an ideal display effect.

Based on the above, the tiled display device of an embodiment of the disclosure is formed by tiling a plurality of display panels, wherein the display panels have transparent parts, and at least a portion of the peripheral edges of the transparent parts of the display panels is overlapped with the tiling edges. In this way, it is not easy for the user to notice the tiling between adjacent display panels in the tiled display device, thus helping to improve the display quality of the tiled display device.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each 5 embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. A display panel having a tiling edge, comprising:
a non-transparent part; a transparent part; and
a transparent substrate supporting the non-transparent part and the transparent part, wherein the transparent part has a peripheral edge, a first portion of the peripheral edge of the transparent part is overlapped with the tiling edge, a second portion of the peripheral edge is overlapped with a boundary of the non-transparent part, the first portion of the peripheral edge is connected to the boundary of the non-transparent part and the display panel ends at the tiling edge, and
wherein the tiling edge of the display panel is constructed by at least the first portion of the peripheral edge of the transparent part and a sidewall of the transparent substrate, and the tiling edge overlaps with the sidewall of the transparent substrate in a plan view.

2. The display panel of claim 1, wherein at least a portion of the transparent part is located between the tiling edge and the non-transparent part.

3. The display panel of claim 1, wherein the non-transparent part comprises:
a plurality of signal lines;
a plurality of pixel circuits electrically connected to the plurality of signal lines; and
a plurality of light-emitting elements driven by the plurality of pixel circuits.

4. The display panel of claim 3, wherein the plurality of light-emitting elements are a plurality of light-emitting diode elements.

5. The display panel of claim 3, wherein the signal lines comprise power lines, scan lines, data lines, other signal lines, or a combination thereof.

6. The display panel of claim 3, wherein the pixel circuits comprise micro integrated circuits.

7. The display panel of claim 6, wherein several of the light-emitting elements are connected to one of the pixel circuits.

8. The display panel of claim 3, wherein the pixel circuits comprise at least one active element and at least one capacitor.

9. The display panel of claim 1, wherein the transparent part is divided into a plurality of transparent sub-parts by the non-transparent part.

10. A tiled display device, comprising at least two display panels, wherein each of the display panels has a tiling edge and comprises:

a non-transparent part; a transparent part; and a transparent substrate supporting the non-transparent part and the transparent part, wherein the transparent part has a peripheral edge, a first portion of the peripheral edge of the transparent part is overlapped with the tiling edge, a second portion of the peripheral edge of the transparent part is overlapped with a boundary of the non-transparent part, the first portion of the peripheral edge is connected to the boundary of the non-transparent part, and the each of the display panels ends at the tiling edge, wherein the tiling edge of the display panel is constructed by at least the first portion of the peripheral edge of the transparent part and a sidewall of the transparent substrate, and the tiling edge overlaps with the sidewall of the transparent substrate in a plan view, and wherein the at least two display panels are tiled together by the tiling edges thereof.

11. The tiled display device of claim 10, wherein the transparent parts of the at least two display panels are aligned with each other.

12. The tiled display device of claim 10, wherein the at least two display panels are tiled along a first direction, and at least portions of the peripheral edges of the transparent parts of the at least two display panels are aligned with each other in the first direction.

13. The tiled display device of claim 10, wherein the non-transparent part of at least one of the at least two display panels comprises:

a plurality of signal lines;

a plurality of pixel circuits electrically connected to the plurality of signal lines; and a plurality of light-emitting elements driven by the plurality of pixel circuits.

14. The tiled display device of claim 13, wherein the plurality of light-emitting elements comprise light-emitting diode elements.

15. The tiled display device of claim 13, wherein the signal lines comprise power lines, scan lines, data lines, other signal lines, or a combination thereof.

16. The tiled display device of claim 13, wherein the pixel circuits comprise micro integrated circuits.

17. The tiled display device of claim 16, wherein several of the light-emitting elements are connected to one of the pixel circuits.

18. The tiled display device of claim 13, wherein the pixel circuits comprise at least one active element and at least one capacitor.

19. The tiled display device of claim 10, wherein the transparent part of at least one of the at least two display panels is divided into a plurality of transparent sub-parts by the non-transparent part.

* * * * *